United States Patent [19]

McLaughlin

[11] 4,308,472
[45] Dec. 29, 1981

[54] CLOCK CHECK CIRCUIT

[75] Inventor: Donald W. McLaughlin, Naperville, Ill.

[73] Assignee: GTE Automatic Electric Labs Inc., Northlake, Ill.

[21] Appl. No.: 99,948

[22] Filed: Dec. 3, 1979

[51] Int. Cl.³ .................... H03K 5/135; H03K 5/14; H03K 5/26
[52] U.S. Cl. ................................. 307/518; 307/471
[58] Field of Search .............................. 307/216, 518

[56] References Cited

U.S. PATENT DOCUMENTS

| | | | |
|---|---|---|---|
| 3,114,109 | 12/1963 | Melas | 307/216 X |
| 3,876,951 | 4/1975 | McLean et al. | 307/216 X |
| 4,031,410 | 6/1977 | Kikuchi | 307/216 X |

*Primary Examiner*—John S. Heyman
*Attorney, Agent, or Firm*—Robert J. Black; Charles A. Doktycz

[57] ABSTRACT

An apparatus adapted to check for the continuous presence of an incoming clock pulse train comprising an exclusive OR gate, to the input of which are coupled the clock pulse train and a second train of clock pulses delayed by one half the period of the incoming clock pulse train. A third train of clock pulses delayed by three quarters of the clock period is utilized to strobe the OR gate output into a pair of flip-flops. If the two inputs to the OR gate are the same a fault exists and a flip-flop is set to indicate on which excursion the fault occurred.

4 Claims, 2 Drawing Figures

CLOCK CHECK CIRCUIT

BACKGROUND OF THE INVENTION

(1) Field of the Invention

This invention relates to a processor controlled communication switching system and, more particularly, to a clock pulse checking circuit for use in such a system.

(2) Description of the Prior Art

In order to provide the necessary reliability required in modern electronic telephone exchanges, duplicate equipment is run in synchronism and other equipment is utilized to monitor it. This is done so that a signal failure will not result in a system outage. The system clock is one of these system modules whose output is essential for the operation of the system. A further requirement is that this output be received at the utilizing modules.

An arrangement for monitoring the system clock operation is disclosed in U.S. Pat No. 3,795,867 issued Mar. 5, 1974 and U.S. Pat. No. 3,803,568 issued Apr. 9, 1974. These patents ensure that clock pulses are available at the output but it cannot monitor the receipt of these pulses of the utilizing module. Further it is not economically feasible to duplicate the transmission paths to these modules.

SUMMARY OF THE INVENTION

It is therefore an object of the present invention to provide a novel clock pulse monitor arrangement.

More particularly, it is an object to provide such an arrangement that is both economical and reliable.

A still further object is to provide this monitor arrangement in such a compact form that it may be located on subsystem modules.

The invention provides an apparatus capable of continuously checking for the presence of the incoming clock pulse train by the use of an exclusive OR gate, to the input of which is coupled the incoming clock pulse train and a second train of clock pulses delayed by one half the period of the incoming clock pulse train. The exclusive OR gate will thus always receive only one true pulse either from the incoming pulse train or from the delayed pulse train. The delay is provided by the use of a delay line having a fixed stable delay equal to one half the period of the incoming pulses. To register a fault and on which excursion of the pulse train may have occurred, there are provided a pair of flip-flops. These have the output of the exclusive OR gate connected to their set inputs, and upon the exclusive OR gate receiving two identical inputs, its output will serve to set one or the other of these flip-flops. These flip-flops are of the D type and require a clock or strobe pulse, this is provided by the use of another delay line which delays the incoming pulse train by three quarters of the period.

BRIEF DESCRIPTION OF THE DRAWINGS

Additional features and advantages of the apparatus in accordance with the present invention will be apparent from the following description together with the accompanying drawing wherein.

DESCRIPTION OF THE PREFERRED EMBODIMENT

Figure 1:
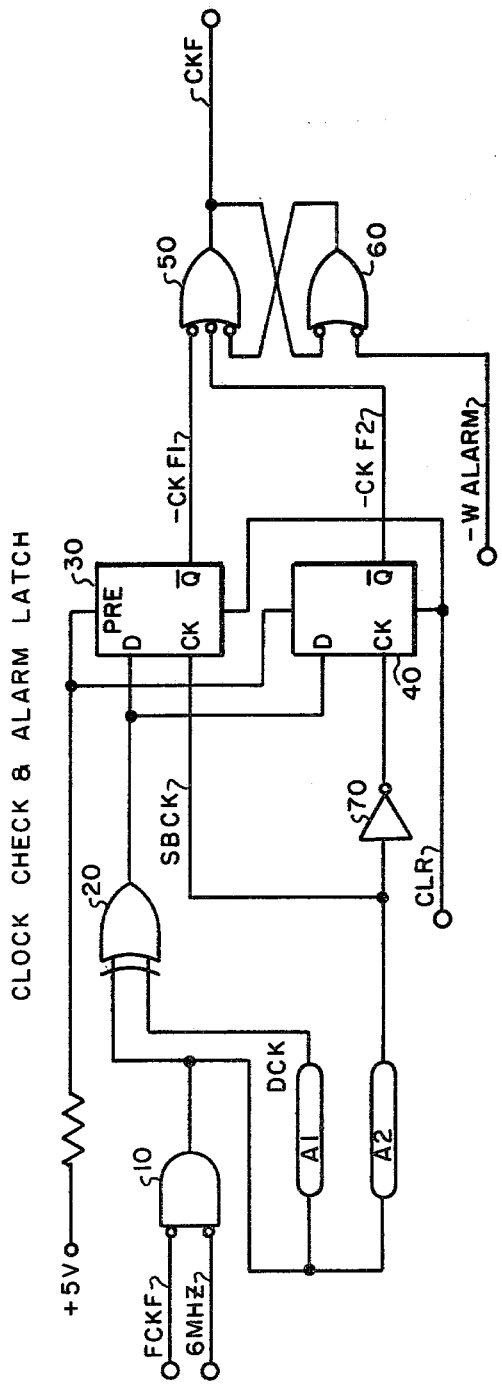
FIG. 1 is a schematic circuit diagram of the clock pulse check circuit in accordance with the present invention.
Figure 2:
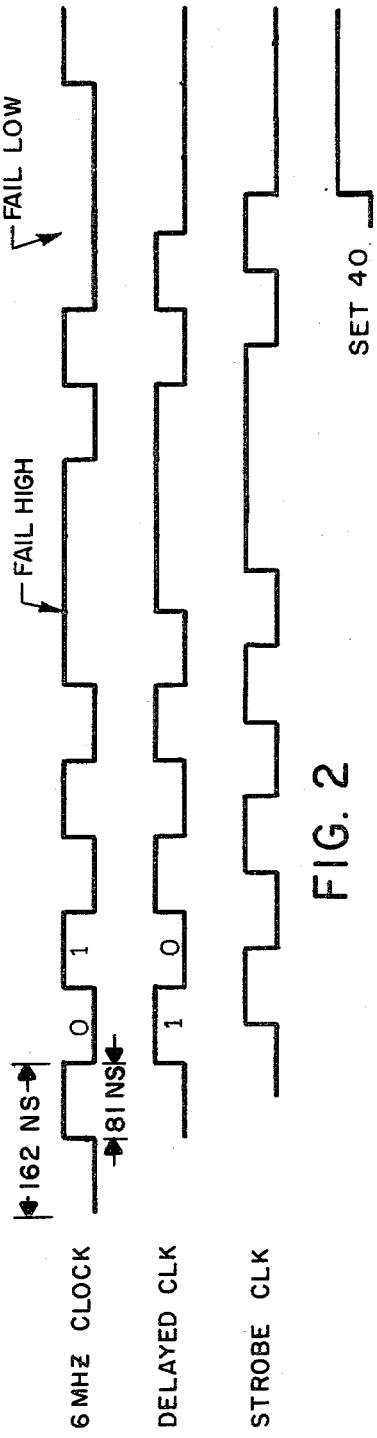
FIG. 2 is a timing diagram useful for a fuller understanding of the operation of the present invention.

This clock check circuit operates from the 6 MHz clock input at the circuit module. This input corresponds to the 6 MHz timing diagram in FIG. 2. Two delay lines A1 and A2 are used to check for the loss of pulses. The first delay line A1 delays the 162 nsec pulse train by one half the period and its resultant waveform is shown in FIG. 2 and labeled Delayed Clk. Thus the output of this delay line is in effect inverted from the incoming pulse train. Both pulse trains are then fed to the input of an exclusive OR gate 20 as shown in FIG. 1 to cause it to have a continuous output, as the clock pulses and the delayed clock pulses alternately drive it. The output of gate 20 is fed to the D inputs of flip-flops 30 and 40 which cannot respond until the further delayed strobe clock pulse from delay line A2 is present. The strobe clock pulses are delayed ¾ of the period and occur at the middle of the output from the exclusive OR gate 20 as shown by the timing chart. If the two inputs to the OR gate are the same a fault exists. The fault will be detected at the first error and both edges of the strobe are checked. The two flip-flops 30 and 40 receive the output of the exclusive OR gate at their set or D inputs. Flip-flop 30 also receives the strobe clock input from delay line A2 at its clock or CK input, while flip-flop 40 receives this same strobe signal inverted at gate 70. To thus sense the two fault conditions (6 MHz clock stuck at 1 or 0) and thus the setting of either of the flip-flops sets the clock fail latch consisting of gates 50 and 60, to generate the signal CKF. The use of a latch is necessary since the clock pulses returning after only a short lapse would reset the flip-flop and the occurrence of a fault would not be recorded.

A fault condition is illustrated for a clock stuck at its high level at the middle section of FIG. 2, where the down going portion of the pulse tain is missing. This level at the input of gate 20 along with the delayed high level from delay line A1 produce a high or true output to the flip-flop set inputs.

This produces no effect upon the flip-flops until the flip-flops are strobed. This strobe signal is also derived from the clock input delayed at delay line A2. At its occurrence flip-flop 30 is set. Flip-flop 40 remains in its reset state since it receives the output of delay line A2 inverted at gate 70.

A fault condition with the clock output stuck at its low level is illustrated at the end section of FIG. 2 where the rising portion of the pulse train is missing. This low level at the input of gate 20 along with the delayed low level from delay line A1 again, produces a true output to the flip-flop set inputs. As in the case with the pulse train stuck at its high level the flip-flops do not respond until strobed by the further delayed clock pulse from delay line A2. This delayed pulse from delay line A2 is at its low level, since the last change in level was from a high to a low level. Thus flip-flop 30 cannot respond. However, the inverted output from gate 70 is true at the input to flip-flop 40 and it will be set.

The clock failure can also be forced for maintenance purposes via signal, force clock failure FCKF by the application of a signal to the input of gate 10. To reset the circuit a signal applied to the lead designated CLR will reset the two flip-flops while a signal to the input labeled WALARM will reset the alarm latch.

The apparatus as shown in FIG. 1 was fabricated employing the commercially available components listed below:

|  |  | Elrod Mfg. |
| --- | --- | --- |
| Delay line | A1, A2 | X79-1113 |
| OR gate | 10 | 74LS140 |
| Exclusive OR gate | 20 | 74LS86 |
| Inverter | 70 | 74LS04 |
| Flip-flops | 30, 40 | 74LS74 |
| Latch | 30-60 | 74LS279 |

While a preferred embodiment of the clock pulse check circuit, according to the invention, has been shown and described, it will be understood that many changes and modifications can be made in the circuit within the spirit and scope of the invention.

What is claimed is:

1. Apparatus for detecting pulse irregularities comprising:
    a first delay means having an input terminal coupled to a pulse source and an output terminal;
    said first delay means operated to delay input pulses by one half their period;
    an exclusive OR means having an output terminal a first input coupled to the pulse source and a second input coupled to said delay means output terminal, whereby an interruption of the incoming pulses produces identical input to said exclusive OR means resulting in an error signal at said output terminal;
    a second delay means also having an input terminal coupled to a pulse source and an output terminal;
    said second delay means operated to delay input pulses by three quarters of their period, and a first and a second bistable device each having a set and a clock input and output means;
    said output terminal of said exclusive OR coupled to the set input of both said first and said second bistable devices;
    said output terminal of said second delay means coupled to the clock input of said first bistable device, and operated by an error signal at said exclusive OR output terminal to set said first bistable device, whereby said bistable device maintains said operated state indicating said pulse irregularity; and
    an inverter coupling said second delay means output terminal to the clock input of said second bistable device.

2. Apparatus as claimed in claim 1, further including a second bistable device having a set input coupled to said exclusive OR output and also a clock input and an output an inverter coupling said second delay means output terminal to the clock input of said second bistable device, said second bistable device operated by an error signal at said exclusive OR output terminal to set said second bistable device during the detection of an irregularity of the opposite polarity of that effective set said first bistable device.

3. Apparatus as claimed in claim 2, further including latching means operated in response to the setting of either said first or said second bistable devices to latch up and produce a clock failure output indication.

4. Apparatus as claimed in claim 3, further including reset means operative to reset said bistable devices and said latch.

* * * * *